US009315687B2

(12) United States Patent
Lopez Quintela

(10) Patent No.: US 9,315,687 B2
(45) Date of Patent: Apr. 19, 2016

(54) CONDUCTIVE INKS OBTAINED BY COMBINING AQCS AND METAL NANOPARTICLES

(75) Inventor: Manuel Arturo Lopez Quintela, Santiago de Compostela (ES)

(73) Assignees: Universidade de Santiago de Compostela, Santiago de Compostela (ES); Nanogap, Ames (ES)

( * ) Notice: Subject to any disclaimer, the term of this patent is extended or adjusted under 35 U.S.C. 154(b) by 9 days.

(21) Appl. No.: 13/511,369

(22) PCT Filed: Nov. 23, 2010

(86) PCT No.: PCT/ES2010/070765
§ 371 (c)(1),
(2), (4) Date: Jul. 18, 2012

(87) PCT Pub. No.: WO2011/064430
PCT Pub. Date: Jun. 3, 2011

(65) Prior Publication Data
US 2012/0315495 A1    Dec. 13, 2012

(30) Foreign Application Priority Data

Nov. 25, 2009  (ES) .................................. 200902230

(51) Int. Cl.
*H01B 1/02* (2006.01)
*C09D 11/52* (2014.01)
(Continued)

(52) U.S. Cl.
CPC *C09D 11/52* (2013.01); *C09D 5/24* (2013.01); *C09D 7/1266* (2013.01);
(Continued)

(58) Field of Classification Search
CPC .......... H05K 3/105; H01B 1/026; H01B 1/02; C23C 18/08; C23C 18/06; H01L 2924/00
USPC ........................................................ 252/512
See application file for complete search history.

(56) References Cited

U.S. PATENT DOCUMENTS

2009/0035852 A1 * 2/2009 Lopez Quintela et al. ... 435/375
2009/0075038 A1   3/2009 Butler et al.
(Continued)

FOREIGN PATENT DOCUMENTS

EP    2114114 A1    11/2009
JP    2007528495 A  10/2007
(Continued)

OTHER PUBLICATIONS

Bakhishev, T., et al., "Investigation of Gold Nanoparticle Inks for Low-Temperature Lead-Free Packaging Technology", "Journal of Electronic Materials", Aug. 18, 2009, pp. 2720-2725, vol. 38, No. 12.
(Continued)

*Primary Examiner* — Harold Pyon
*Assistant Examiner* — William Young
(74) *Attorney, Agent, or Firm* — Hultquist, PLLC; Mary B. Grant

(57) ABSTRACT

The invention relates to conductive inks obtained by combining AQCs and metal nanoparticles. Atomic quantum clusters (AQCs), which melt at temperatures of less than 150° C., are used as low-temperature "flux" for the formulation of conductive inks. The combination of AQCs with bimodal and trimodal mixtures of nanoparticles of various sizes guarantees the elimination of free volumes in the final sintering of the nanoparticles in order to achieve electronic structures with very low resistivity (close to that of the bulk material) with low-temperature thermal treatments (<150° C.).

20 Claims, 3 Drawing Sheets

(51) Int. Cl.
*C09D 5/24* (2006.01)
*C09D 7/12* (2006.01)
*C09D 11/38* (2014.01)
*H05K 1/09* (2006.01)
*C08K 3/08* (2006.01)

(52) U.S. Cl.
CPC ............ *C09D 7/1275* (2013.01); *C09D 11/38* (2013.01); *H05K 1/097* (2013.01); *C08K 3/08* (2013.01); *H01B 1/02* (2013.01); *H05K 2201/0257* (2013.01); *H05K 2201/0266* (2013.01); *Y10T 428/31678* (2015.04); *Y10T 428/31681* (2015.04); *Y10T 428/31692* (2015.04); *Y10T 428/31699* (2015.04); *Y10T 428/31703* (2015.04)

(56) References Cited

U.S. PATENT DOCUMENTS

| | | | |
|---|---|---|---|
| 2009/0142481 | A1 | 6/2009 | Chopra et al. |
| 2009/0146117 | A1* | 6/2009 | Suenaga et al. ............ 252/520.3 |
| 2010/0009071 | A1* | 1/2010 | Chopra et al. ................ 427/123 |
| 2010/0269635 | A1* | 10/2010 | Vanheusden et al. ........... 75/370 |

FOREIGN PATENT DOCUMENTS

| | | |
|---|---|---|
| WO | 2005090954 A1 | 9/2005 |
| WO | 2008048316 A2 | 4/2008 |
| WO | 2008100568 A1 | 8/2008 |
| WO | 2009048983 A2 | 4/2009 |

OTHER PUBLICATIONS

Fuller, S., et al., "Ink-Jet Printed Nanoparticle Microelectromechanical Systems", "Journal of Microelectromechanical Systems", Feb. 2002, pp. 54-60, vol. 11, No. 1.

Kansal, A., et al., "Computer Generation of Dense Polydisperse Sphere Packings", "The Journal of Chemical Physics", Nov. 8, 2002, pp. 8212-8218, vol. 117, No. 18.

Liniger, E., et al., "Packing and Sintering of Two-Dimensional Structures Made From Bimodal Particle Size Distributions", "Journal of the American Ceramic Society", Nov. 1987, pp. 843-849, vol. 70, No. 11.

Noh, Y., et al., "Downscaling of Self-Aligned, All-Printed Polymer Thin-Film Transistors", "Nature Nanotechnology", Nov. 18, 2007, pp. 784-789, vol. 2.

Perelaer, J., et al., "Ink-Jet Printing and Microwave Sintering of Conductive Silver Tracks", "Advanced Materials", Jul. 18, 2006, pp. 2101-2104, vol. 18, No. 16.

* cited by examiner

CONDUCTIVE INKS OBTAINED BY COMBINING AQCS AND METAL NANOPARTICLES

CROSS-REFERENCE TO RELATED APPLICATIONS

This application is a U.S. national phase under the provisions of 35 U.S.C. §371 of International Patent Application No. PCT/ES2010/070765 filed Nov. 23, 2010, which in turn claims priority of Spanish Patent Application No. P200902230 filed Nov. 25, 2009. The disclosures of such international patent application and Spanish priority patent application are hereby incorporated herein by reference in their respective entireties, for all purposes.

FIELD OF THE ART

The present invention relates to a new formulation of colloidal inks based on using atomic quantum clusters (AQCs), (synthesized according to the process described in patent ES2277531) in combination with mixtures of metal nanoparticles of various sizes. Electronic structures with very low resistivities (close to that of the bulk material) are achieved with this formulation using thermal treatments at low temperatures (<150° C.). The conductive inks serve, among other applications, for use in the printed electronics industry.

STATE OF THE ART

Currently the use of metal nanoparticles, such as Ag, Cu, etc., for the preparation of conductive pastes and inks, materials for electronic contacts, etc., is one of the fields with the greatest research activity due to their innumerable possible applications in the field of the printed electronics, in all of its forms ranging from screen-printing, pad-printing and inkjet printing to the different mass-printing methods, such as offset printing, engraving and flexography. The possibility of manufacturing low-cost electronic products on common-use materials, such as paper, plastic and textile, has initiated a new era in the field of consumer electronics. Within all these technologies, the suitable design of stable colloidal dispersions of metal nanoparticles (conductive inks from nanoparticles) is one of the most important challenges for the expansion of this enormous potential market.

For their application, conductive inks from nanoparticles have to possess certain characteristics which must be optimized for achieving suitable results in the different forms of printed electronics (see, for example, the use of Ag and Au nanoparticles in of ink-jet printing techniques: J. Perelaer et al., *Advanced Materials* 2006, 18, 2101; Y. -Y. Noh et al., *Nature Nanotechnology* 2007, 2 784A, respectively). Apart from the problems of wetness and adhesion to the substrate used, for which different strategies have been developed in the formulation of the inks, the fundamental problem resides in achieving high conductivities in the metal structures printed by means of conductive inks.

Regardless of the type of printing used and the specific formulation of the conductive ink, the process of printing with inks is associated with the drying of the ink and the sintering of the particles deposited on the substrate. This sintering process necessarily involves an increase of the temperature or curing. The problem of the suitable ink formulation for achieving optimal electric conduction in the final printing at temperatures that are low enough so as to not damage the substrate then arise.

Not long ago it was normal to use particles of sizes larger than 200-500 nm in conductive inks using colloidal dispersions. Nevertheless, it was quickly seen that using particles with sizes less than approximately 250 nm presented notable advantages, such as improvements in quality of the printed images, better reproducibility, etc. So, for example, Fuller et al. (Fuller, S. B.; Wilhelm, E. J.; Jacobson, J. M. *J. Microelectromech. Syst.* 2002, 11, 54) showed that when using colloidal inks containing Au and Ag nanoparticles from 5 to 7 nm in an organic solvent, high performance electronic structures, sintering the printed circuit boards at 300° C., can be obtained by ink-jet printing. However, the sintering carried out at these temperatures can lead to the destruction of the substrate on which printing is to be done. The current challenge in the use of nanoparticles consists of obtaining these high performances at much lower temperatures, such as for example temperatures less than 150° C. and preferably less than 100° C., in order to enable applying them on temperature-sensitive substrates, such as specific types of polymers (among which polycarbonate with glass transition temperatures of approximately 150° C. and melting temperatures of approximately 230° C., can be mentioned), paper, etc.

In turn, patent ES2277531 (B2) and its international application WO 2007/017550, disclose a process for obtaining atomic quantum clusters, referred to as AQCs, with sizes less than 2 nm, and preferably less than 1 nm, of different metals. Said documents also disclose how to proceed for the separation, stabilization and functionalization thereof. It is indicated in the method fundamentals that the physicochemical properties of the clusters sintered by said process are different from nanoparticles. This is due to the fact that a separation of the energy levels is originated in the AQCs at the Fermi level (HOMO-LUMO gap or bandgap), which means that these particles stop behaving like metal particles, which is readily seen by the suppression of their plasmon band and the occurrence of different bands due to electron transitions between the different energy levels of the clusters, which then stop behaving like a "metal particle" and their behavior becomes molecular, i.e., they stop being particles and really become "molecules". Even the metal nanoparticles approaching the sizes of the atomic quantum clusters (ACQs) therefore have properties and behaviors completely different form those of the clusters, so an unexplored area of the art opens up. New properties thus appear in these clusters that are not present in nanoparticles, microparticles or the bulk metal material. It is precisely the fact that their behavior and properties are different, due to the important quantum effects characterizing these clusters of atoms, that make it impossible to extrapolate their properties simply from those of the metal nanoparticles, and therefore make it impossible to predict their properties and performances for applications such as the production of conductive inks as proposed in the present invention.

FIG. 1 shows the experimental results of melting temperatures obtained with Ag AQCs obtained by the processes described in patent ES2277531. FIG. 1a shows a TEM image of Ag clusters approximately 1 nm in size deposited on a graticule. FIG. 1b shows the image of the same sample once the graticule is subjected to treatment at 100° C. for a few seconds. It is observed that the Ag AQCs have melted. Precisely because the clusters melt at very low temperatures in comparison with metal nanoparticles, they will conveniently be used in the present invention for optimizing the formulation of conductive inks.

In addition, another important problem when a particle-based conductive ink is deposited is the interparticle spaces present in the printed electronic structure. These gaps cause an important reduction of conductor material present in the cross-section of the deposited film, thus reducing the conductivity, or in other words, considerably increasing its electric resistance. The minimal interparticle space (free space) that can be obtained by means of monodispersed spheres is 26% for an ideal close packing (fcc) and 36% for an ideal random close packing (rcp) (A. R. Kansal et al. *J. Chem. Phys.* 2002, 117, 8212). In practical cases (polydispersed and not perfectly spherical particles), this free space is enormously increased, thus provoking a very important reduction of the conductive properties.

In the present invention, besides the use of the AQCs as low temperature fluxes, mixtures of nanoparticles of various sizes are used for eliminating the mentioned empty spaces. To determine the size ratio of the different nanoparticles used, theoretical estimates are used that predict that for a size ratio between spheres ($r_l/r_s$, where $r_l$ is the radius of the large nanoparticles and $r_s$ corresponds to radius of the small nanoparticles) of approximately 5 to 10 times (A. R. Kansal et al. *J. Chem. Phys.* 2002, 117, 8212), for the case of random closed packing, reductions of the free volume of approximately 60% of the initial free volume are obtained. An additional increase of the size ratio does not yield additional notable reductions of said free volume. In addition, when deciding the size of the small nanoparticles to be introduced into the mixture of nanoparticles it must also be considered that an increase of the size ratio can lead to a phase separation between the two types of nanoparticles (E. Liniger et al. *J. Am. Cer. Soc.* 2008, 70, 843), so when selecting the sizes it is necessary to search for a solution of compromise. In addition, taking into account that the free volume left by the larger sized particles is, as previously mentioned, approximately 30% and that the reduction of the free volume using a particle size ratio of $r_s/r_l=1/5-1/10$ is 60%, the ratio of volumes occupied by the small and large particles is approximately $V_s/V_l=18\%/70\%\approx0.3$, i.e., $V_s/V_l=1/3$.

Theoretical Basis of the Present Invention

The present invention relates to a new formulation of stable colloidal inks based on mixtures of metal nanoparticles of various sizes and of semi-conductive flux elements with melting points less than 150° C. and advantageously with melting points less than 100° C. Said flux elements, acting as bonding elements (sintering elements), allow the surprising effect of achieving metal contact between the nanoparticles, achieving electronic structures with very low resistivities (close to those of the bulk material) with thermal treatments at very low temperatures (<150° C.)

Said non-conductive flux elements are atomic quantum clusters (AQCs) synthesized according to the process described in patent ES2277531 and its corresponding WO 2007/017550 A1.

The inclusion of the AQCs as flux elements in the formulation of the ink is not an obvious step in developing a conductive ink because, surprisingly, despite said flux elements not being conductive but rather semi-conductive, the result is a conductive ink with excellent conductive properties, which is counter to the standard practice, consisting of using exclusively conductive particles when making an ink with high conductive performance.

Combining this aspect, i.e., the property of the low melting temperatures of the atomic quantum clusters and the reduction of the inter-particle free space necessary to achieve printing using nanoparticle inks, the formulation herein proposed as object of the invention attempts to achieve, on one hand, a maximum reduction of that free space by means of combining at least nanoparticles of two different sizes and furthermore a final component using a particular proportion of AQCs for achieving a greater "inter-particle connection". The nanoparticles of the largest size constitute, in a greater proportion, the largest volumetric percentage of the ink to be obtained, which assures low cost as well as a greater ease for adjusting the physicochemical properties (viscosity, surface tension, . . . ) to the specific needs of the ink (type of printing, substrate, . . . ). The nanoparticles of an intermediate size serve, in a lesser proportion, for occupying the largest part of the gaps left by the spheres of largest size, thereby increasing the possibility of greater packing in the final deposited structure. Finally, the AQCs are used, in much smaller proportions, as a low temperature "flux" which allows 1) occupying the gaps left by the mixture of nanoparticles due to their size being so small, and 2) the bonding and sintering of the ink nanoparticles at very low temperatures without needing to melt of the remaining nanoparticles which would require higher temperatures.

Two specific examples of how to select the sizes for the preparation of the conductive inks based on mixtures of nanoparticles and AQCs are described below.

EXAMPLES OF APPLICATION

1. Trimodal Distribution+AQCs

The optimal size for the largest nanoparticles to be used in the inks is from 100 to 250 nm. Larger nanoparticles have greater problems of stability and sintering at very high temperatures due to their smaller surface/volume ratio. Smaller nanoparticles are then used for occupying the gaps left by the larger nanoparticles, as previously mentioned. The size chosen for the smaller nanoparticles is such that the size ratio of the nanoparticles is approximately 1/5 ($r_s/r_l=1/5$) for achieving a greater reduction of the free volume without a loss of colloidal stability. This last aspect, although enabling compensation with additives, always entails an additional difficulty in the final formulation of the inks. Therefore considering the size of the largest nanoparticles ($r_l=100-250$ nm), the size of the smallest nanoparticles is $r_s=25-50$ nm, the 1/5 ratio between the chosen sizes being maintained in any case in these intervals. The volumetric ratio (or weight if spheres of the same material are being used) of large to small nanoparticles to be used is approximately 1/3, as previously mentioned, for covering the interstitial spaces left by the large particles. The free volume left by the large nanoparticles is thereby notably reduced. A still smaller third nanoparticle size is used for attaining a more significant practical reduction of the free volume, such that the size ratio between the intermediate and smallest nanoparticles is approximately equal to that existing between the large and intermediate nanoparticles. For the example being considered, the smallest nanoparticles of approximately $r_{ss}=5-10$ nm ($r_{ss}=$radius of the smallest particles). Again, the volumetric ratio (or weight in the case of using the same type of material) of the intermediate nanoparticles to the smallest nanoparticles is approximately 1/3 (i.e., approximately 1/10 of the volume of the largest particles). The introduction of this third particle size further complicates the dispersion being separated in phases by size.

Finally, the AQCs described in patent ES2277531 are used as 1) low temperature flux, and 2) filler for the smallest interstitial gaps. The volumetric ratio (or weight in the case of using the same material) to be used is again approximately 1/3 with respect to the smallest particles (i.e., approximately 1/30 of the volume of the largest particles). It must be understood that this ratio of AQCs is the maximum optimal value, which can be lowered in the interest of lowering the price of the ink. Therefore, other approximate ratios are contemplated such as, for example: 1/4, 1/5, 1/6.

2. Bimodal Distribution+AQCs

The formulation of the ink can be simplified by introducing only a bimodal distribution+AQCs. The reason is that, in practice, the nanoparticles used are not monodispersed (understanding monodispersity as the ratio between the standard deviation of size (s) and the average size (x) being less than 10%) and always have a certain degree of more or less polydispersity. This polydispersity (s/x>10%) favors, on one hand, the stability inhibiting the phase separation by sizes and, at the same time, reduces the free volume of the interstitial gaps. For this reason formulations can be used in which, assuming the large nanoparticles are, again, in the range of 100-250 nm, the size of the smallest nanoparticles can be lowered to 10 times the initial size. In other words, the size of the small nanoparticles to be used is 10-25 nm, maintaining the ratio of 1/10 between the mean sizes of the small and large particles chosen. The volumetric ratio of the large and small nanoparticles continues to be approximately 1/3. The next smallest particle size to be introduced in this case, maintaining that size ratio of 1/10, would be approximately 1 nm, so for this example the AQCs are used as the third component of the mixture and at the same time as "fluxes". The maximum optimal ratio of AQCs to be used is approximately 1/3 with respect to the smallest nanoparticles, i.e., approximately 1/10 to the large particles.

Proposed Method of the Invention

According to that described above, the combination of semi-conductive flux elements, and particularly of AQCs and nanoparticles of various sizes for the optimization of conductive ink formulations, is proposed, understanding AQCs as:
    AQCs, stable atomic quantum clusters, characterized by being made up of less than 500 metal atoms (Mn, n<500),
    AQCs characterized by being made up of less than 200 metal atoms (Mn, n<200),
    AQCs characterized by being made up of between more than 2 and less than 27 metal atoms (Mn, 2<n<27),
    AQCs characterized by being made up of between 2 to 5 metal atoms,
    AQCs, where the metals are selected from Au, Ag, Co, Cu, Pt, Fe, Cr, Pd, Ni, Rh, Pb or their bi-metal and multi-metal combinations.

The present invention proposes using AQCs as low temperature "flux" materials in the formulation of conductive inks formed by combining the AQCs and at least two types of metal nanoparticles of various sizes: large nanoparticles (between 100 and 250 nm) and small particles (between 10 and 25 nanometers), always maintaining a ratio of 1/10 between the mean size of the large and small nanoparticles. The weight ratio (for equal materials) to be used is approximately 1/3 of nanoparticles of an immediately smaller size with respect to the immediately larger size. These ratios must be modified in proportion to their densities when different materials are used for each nanoparticle size.

Another preferred possibility is to use the combination of the AQCs with a mixture of 3 different sizes: large nanoparticles (between 100 and 250 nm), intermediate nanoparticles (between 25 and 50 nm) and small nanoparticles (between 5 and 10 nm), always maintaining in each case a ratio of 1/5 between the larger and immediately smaller particle sizes. Again, for this case the weight ratio (for equal materials) to be used is 1/3, being modified in proportion to their densities when different materials are used for each size.

For the present invention, the metals of the nanoparticles to be used are selected from Au, Ag, Co, Cu, Pt, Fe, Cr, Pd, Ni, Rh, Pb or their bi-metal and multi-metal combinations. However, due to their economic advantages, it is preferable to use materials such as Cu, Fe, or Ag for the largest nanoparticles, since they make up the greatest part of the material to be used in the formulation of the conductive inks. For the smallest nanoparticles or clusters, due to the smaller proportion used, more nobles materials can be used for the purpose of preventing oxidation processes which reduce the final conductivity of the printed electronic structures.

Due to the presence of the AQCs which melt at very low temperatures (<150° C.), the conductive inks described are able to be applied to temperature-sensitive substrates, such as paper or polymers of the polyamide type, Kapton, flexible or relatively non-flexible polymers, products of polyethylene, polypropylene, products containing acrylates, polymethylmethacrylate, copolymers of the aforementioned polymers or combinations thereof and also polymer films containing at least one from the group consisting of polyesters, polyamides, polycarbonates, polyethylene, polypropylene, as well as their copolymers and combinations thereof.

In turn, a process for the preparation of conductive inks is proposed, characterized by the following steps:
a) mixing metal nanoparticles of various sizes.
b) adding semi-conductor element, which is a low-temperature flux, the melting temperature of which is substantially less than that of the initial mixture of metal nanoparticles, and particularly less than 150° C., the size of said semi-conductor element being less than 2 nm.
c) depositing the ink on any one of the following substrates: paper, polymers of the polyamide type, Kapton, flexible or relatively non-flexible polymers, products of polyethylene, polypropylene, products containing acrylates, polymethylmethacrylate, copolymers of the aforementioned polymers or combinations thereof.
d) increasing the temperature of the ink once deposited on the substrate for achieving the sintering thereof, such that:
    the metal nanoparticles do not reach their melting point.
    the semi-conductor flux element is melted, thus allowing metal contact between the metal nanoparticles, resulting in high conductivities.

Example

Synthesis of an Ink for Inkjet Printing Containing a Bimodal Distribution of Nanoparticles and AQCs 50 g of an ink based on bimodal mixtures of nanoparticles and AQCs, with a final concentration of 30% Ag (by weight), for use as a conductive ink in inkjet printing was synthesized.

The final formulation of the ink is made up of a bimodal distribution of nanoparticles+AQCs, using a 50/50 by weight mixture of ethylene glycol (EG)/ethanol (E). The particles used in the bimodal distribution were: 1) large Ag nanoparticles, with a mean size of 50 nm and a size distribution represented in FIG. 2; 2) small Ag nanoparticles, with a mean size of 5 nm and a size distribution represented in FIG. 3. The AQCs used were Ag clusters of a size less than 1 nm, as seen in FIG. 4.

The final composition of the ink of the example for 50 g of conductive ink at 30% Ag was:
    25% large Ag nanoparticles: 12.5 g.
    4.9% small Ag nanoparticles: 2.45 g.
    0.1% Ag AQCs: 0.05 g.

35% ethylene glycol (EG): 17.5 g.

35% ethanol (E): 17.5 g.

The formulation was prepared as follows: first, 25 L of a formulation of large nanoparticles dispersed in water with a concentration of 0.5 g Ag/L of $H_2O$ were taken. This solution was centrifuged, a paste of nanoparticles being obtained to which 17.5 g of EG were added, and it was stirred until complete redispersion.

In addition, 0.05 L of a dispersion of Ag AQCs with a concentration of 1 g of AQCs/L of $H_2O$ was taken, being added to the mixture of nanoparticles in EG. This new mixture was concentrated in a rotary evaporator to remove all the water.

Then 245 g of a dispersion of small nanoparticles in EtOH with a concentration of 10 mg of Ag/g of EtOH were added to the mixture.

Finally, the resulting mixture was concentrated in a rotary evaporator to remove EtOH until achieving an EtOH weight of 17.5 g.

A printed circuit board printed with the ink of the example using a Fujifilm Dimatix printer on a Kapton substrate and subjected to thermal treatment at 100° C. for 30 minutes can be seen in FIG. 5. The conductivity of the lines of the circuit board thus obtained was 1.3-2.5 Ohms.

Figure 1A:
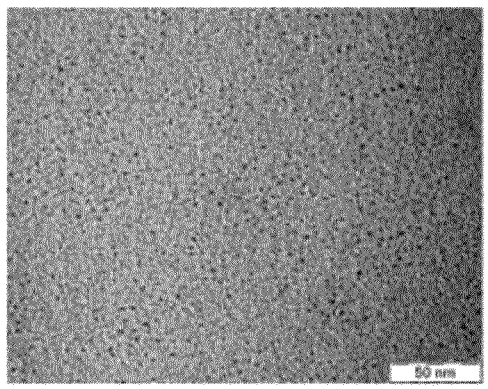
FIG. 1 shows transmission electron microscopy images of Ag clusters synthesized according to the description of patent ES2277531 and deposited on the microscope graticule (FIG. 1a) and of the same sample of clusters once the graticule was heated at 100° C. for 30 seconds (FIG. 1b).
Figure 1B:
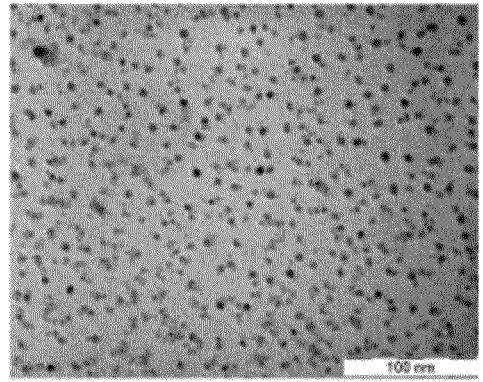
Figure 2:
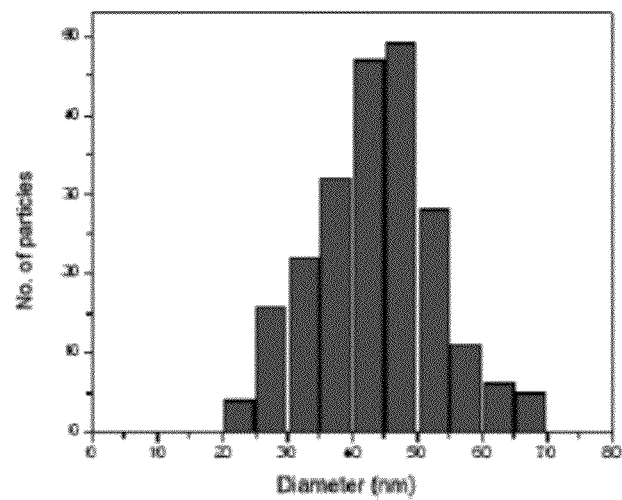
FIG. 2 shows the size distribution of the largest Ag nanoparticles used in the formulation of the ink of the example.
Figure 3:
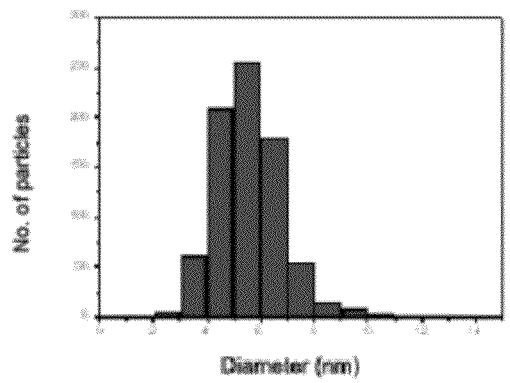
FIG. 3 shows the size distribution of the smallest Ag nanoparticles used in the formulation of the ink of the example.
Figure 4:
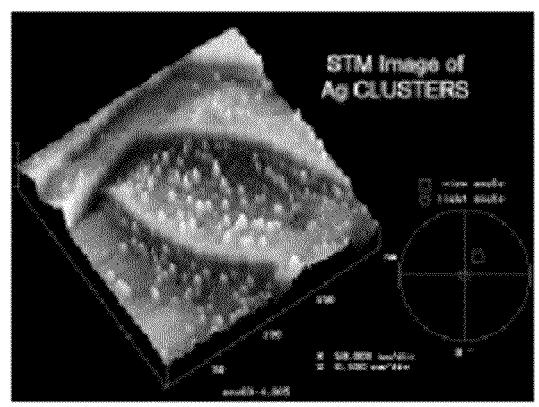
FIG. 4 shows a scanning tunneling microscopy image of Ag AQCs deposited on monatomic terraces of Au(111) showing that the mean size of the clusters is <1 nm.
Figure 5:
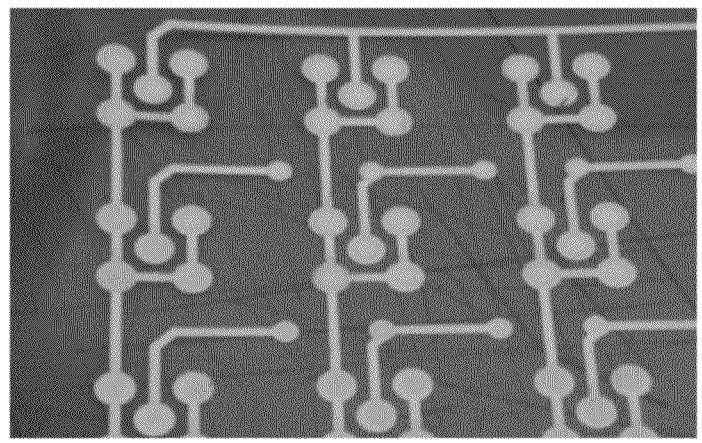
FIG. 5 shows a printed electronic circuit board printed on Kapton by means of the ink of Example 1 using a Fujifilm Dimatix printer, after having site treated at 100° C. for 30 minutes.

The invention claimed is:

1. Conductive inks, consisting of:
   a) metal nanoparticles,
   b) a semi-conductive component consisting of stable metallic atomic quantum clusters (AQCs), wherein the size of the AQCs is less than 2 nm, and
   c) a solvent.

2. The conductive inks according to claim 1, wherein the melting temperature of the AQCs is less than or equal to 150° C.

3. The conductive inks according to claim 1, wherein the AQCs are made up of from 2 to 27 metal atoms or from 2 to 5 metal atoms.

4. The conductive inks according to claim 1, wherein the metals for the AQCs are selected from the group consisting of Au, Ag, Co, Cu, Pt, Fe, Cr, Pd, Ni, Rh, Pb, and their bimetal and multi-metal combinations.

5. The conductive inks according to claim 1, wherein the metal nanoparticles comprise metal(s) selected from the group consisting of Au, Ag, Co, Cu, Pt, Fe, Cr, Pd, Ni, Rh, Pb, and their bi-metal and multi-metal combinations.

6. The conductive inks according to claim 5, wherein the metal nanoparticles comprise bimodal mixtures of large nanoparticles and small nanoparticles, wherein the large nanoparticles comprise nanoparticles having size in a range of from 20 to 100 nm and the small nanoparticles comprise nanoparticles having size in a range of from 2 to 10 nm.

7. The conductive inks according to claim 5, wherein the metal nanoparticles comprise bimodal mixtures of large nanoparticles and small nanoparticles, wherein the large nanoparticles comprise nanoparticles having size in a range of from 20 to 70 nm and the small nanoparticles comprise nanoparticles having size in a range of from 2 to 11 nm.

8. The conductive inks according to claim 5, wherein the metal nanoparticles comprise bimodal mixtures of large nanoparticles and small nanoparticles, wherein the large nanoparticles comprise nanoparticles having a mean size of 50 nm and the small nanoparticles comprise nanoparticles having a mean size of 5 nm.

9. The conductive inks according to claim 5, wherein the metal nanoparticles comprise bimodal mixtures of large nanoparticles and small nanoparticles wherein the large nanoparticles comprise nanoparticles having size in a range of from 100 to 250 nm and the small nanoparticles comprise nanoparticles having size in a range of from 10 to 25 nm.

10. The conductive inks according to claim 9, wherein the size ratio between mean sizes of the small and large nanoparticles is approximately 1/10.

11. The conductive inks according to claim 9, wherein the volumetric ratio of AQCs to small nanoparticles and of small nanoparticles to large nanoparticles is approximately 1/3.

12. The conductive inks according to claim 5, wherein the metal nanoparticles are trimodal mixtures of large nanoparticles, intermediate nanoparticles and small nanoparticles wherein the large nanoparticles comprise nanoparticles having a size of from 100 to 250 nm, the intermediate nanoparticles comprise nanoparticles having a size of from 25 to 50 nm, and the small nanoparticles comprise nanoparticles having a size of from 5 to 10.

13. The conductive inks according to claim 12, wherein the volumetric ratio of AQCs to the large nanoparticles is approximately 1/30 or smaller.

14. The conductive inks according to claim 12, wherein mean size ratio of the small to intermediate nanoparticles and of the intermediate nanoparticles to the large nanoparticles is approximately 1/5.

15. A printing process, comprising printing conductive inks according to claim 1, on temperature-sensitive substrates selected from the group consisting of paper, polymers of the polyamide type, Kapton, flexible or non-flexible polymers, products of polyethylene, polypropylene, products containing acrylates, polymethylmethacrylate, copolymers of the aforementioned polymers, and combinations of the aforementioned polymers.

16. A process comprising sintering conductive inks according to claim 1, said semi-conductive component acting as a bonding agent or link between metal nanoparticles of various sizes, thereby allowing electric conductivity.

17. The process according to claim 16, wherein the conductive inks are applied in printed electronics for screenprinting, pad-printing or inkjet printing.

18. The process according to claim 16, wherein the conductive inks are applied in mass-printing, offset printing, engraving or flexography.

19. The process according to claim 16, further comprising printing the conductive inks on temperature-sensitive substrates selected from the group consisting of paper, polymers of the polyamide type, Kapton, flexible or relatively non-flexible polymers, products of polyethylene, polypropylene, products containing acrylates, polymethylmethacrylate, copolymers of the aforementioned polymers or combinations thereof.

20. The process according to claim 16, further comprising printing the conductive inks on polymer films containing at least one material selected from the group consisting of polyesters, polyamides, polycarbonates, polyethylene, polypropylene, and their copolymers and combinations thereof.

* * * * *